(12) United States Patent
Val et al.

(10) Patent No.: US 7,476,965 B2
(45) Date of Patent: Jan. 13, 2009

(54) ELECTRONIC DEVICE WITH INTEGRATED HEAT DISTRIBUTOR

(75) Inventors: Christian Val, St Remy les Chevreuse (FR); Olivier Lignier, Versailles (FR); Regis Bocage, Chaville (FR)

(73) Assignee: 3D Plus, Buc Cedex (FR)

( * ) Notice: Subject to any disclaimer, the term of this patent is extended or adjusted under 35 U.S.C. 154(b) by 0 days.

(21) Appl. No.: 11/575,751

(22) PCT Filed: Sep. 7, 2005

(86) PCT No.: PCT/EP2005/054419

§ 371 (c)(1),
(2), (4) Date: Mar. 21, 2007

(87) PCT Pub. No.: WO2006/032611

PCT Pub. Date: Mar. 30, 2006

(65) Prior Publication Data

US 2007/0262443 A1 Nov. 15, 2007

(30) Foreign Application Priority Data

Sep. 21, 2004 (FR) .................................. 04 09974

(51) Int. Cl.
*H01L 23/48* (2006.01)

(52) U.S. Cl. ........................ 257/693; 257/700; 257/723; 257/773; 257/775; 257/776; 257/E23.015; 257/E23.02; 257/E23.062

(58) Field of Classification Search ................. 257/276, 257/625, 675, 700, 706, 707, 712–722, 737, 257/738, 772, 778, 779, 796, E33.075, E31.131, 257/E23.051, E23.08–E23.113; 228/180.22; 361/701, 702, 709, 718, 719
See application file for complete search history.

(56) References Cited

U.S. PATENT DOCUMENTS

| 4,408,256 | A | 10/1983 | Val |
| 4,413,170 | A | 11/1983 | Val et al. |
| 4,518,818 | A | 5/1985 | Le Ny et al. |
| 4,546,028 | A | 10/1985 | Val |
| 4,553,020 | A | 11/1985 | Val |
| 4,559,579 | A | 12/1985 | Val |
| 4,639,826 | A | 1/1987 | Val et al. |
| 4,654,694 | A | 3/1987 | Val |
| 4,755,910 | A | 7/1988 | Val |
| 5,002,895 | A | 3/1991 | Le Parquier et al. |
| 5,237,204 | A | 8/1993 | Val |
| 5,323,533 | A | 6/1994 | Val |

(Continued)

*Primary Examiner*—Jasmine J Clark
(74) *Attorney, Agent, or Firm*—Lowe Hauptman Ham & Berner, LLP

(57) ABSTRACT

The present invention relates to an electronic device incorporating a heat distributor. It applies more particularly to devices of the plastic package type, with one or more levels of components. According to the invention, the electronic device, for example of the package type, is provided for its external connection with pads distributed over a connection surface. It includes a thermally conducting plate lying parallel to said connection surface and having a nonuniform structure making it possible, when the device is exposed to a given external temperature, to supply a controlled amount of heat to each external connection pad according to its position on the connection surface. If the device is a package comprising a support of the printed circuit type, the conducting plate will advantageously form an internal layer of said support.

20 Claims, 7 Drawing Sheets

U.S. PATENT DOCUMENTS

| | | |
|---|---|---|
| 5,400,218 A | 3/1995 | Val |
| 5,461,545 A | 10/1995 | Leroy et al. |
| 5,523,230 A | 6/1996 | Smith |
| 5,637,536 A | 6/1997 | Val |
| 5,640,760 A | 6/1997 | Val et al. |
| 5,847,448 A | 12/1998 | Val et al. |
| 5,885,850 A | 3/1999 | Val |
| 6,058,012 A | 5/2000 | Hallowell |
| 6,307,261 B1 | 10/2001 | Val et al. |
| 6,716,672 B2 | 4/2004 | Val |
| 6,809,367 B2 | 10/2004 | Val |
| 7,087,511 B2 * | 8/2006 | Akram et al. ............... 438/612 |
| 2002/0190362 A1 | 12/2002 | Bacher |
| 2003/0080392 A1 | 5/2003 | Koduri |

* cited by examiner

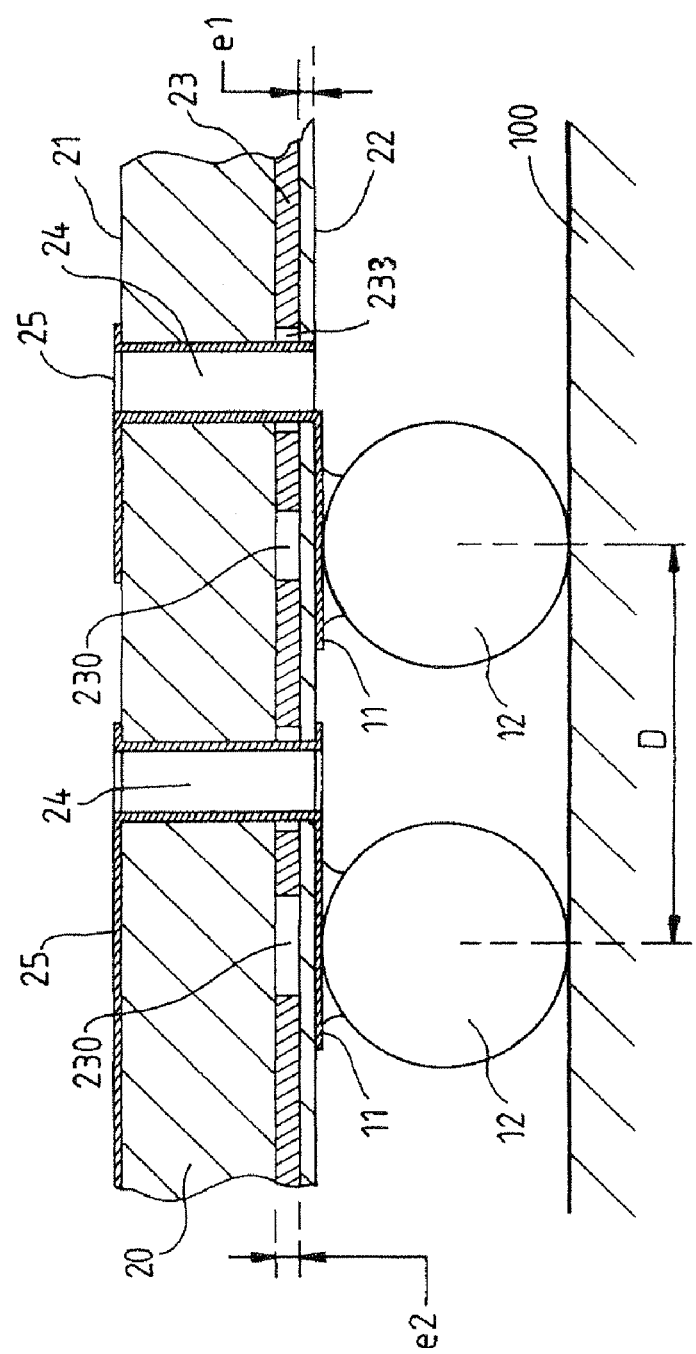

ELECTRONIC DEVICE WITH INTEGRATED HEAT DISTRIBUTOR

CROSS-REFERENCE TO RELATED APPLICATIONS

The present Application is based on International Application No. PCT/EP2005/054419, filed on Sep. 7, 2005, which in turn corresponds to French Application No. 0409974 filed on Sep. 21, 2004, and priority is hereby claimed under 35 USC §119 based on these applications. Each of these applications are hereby incorporated by reference in their entirety into the present application.

TECHNICAL FIELD

The present invention relates to an electronic device incorporating a heat distributor. It applies more particularly to devices of the plastic package type, with one or more levels of components.

BACKGROUND OF THE INVENTION

To meet the ever growing requirement for smaller dimensions of electronic components, electronic devices are known from the prior art that are in the form of packages in which the components are placed, for example ceramic packages or plastic packages, the latter category being the most widespread. The package comprises a support made of insulating material on which the components are arranged, on one or more levels, the components being covered with an encapsulant, for example made of plastic of the epoxy type. On each of its internal and external faces, the support has connection pads, respectively for connection of the components and for connection of the package to a substrate.

FIGS. 1A and 1B show, respectively, examples of a BGA (Ball Grid Array) package 1 and an example of an LGA (Land Grid Array) package 1' that are intended to be connected to a substrate 100. Only the outline 10 of the package has been shown. Placed inside are the support and the electronic components on one or more levels (not shown). The packages are equipped with external connection pads 11 for connection to connection pads 101 on the substrate 100. In the example shown in FIG. 1A, which is the most common, the external connection pads 11 of the package are provided with balls 12, hence the name BGA, making it very easy to position the facing connection pads. The balls are soldered to the pads 101 on the substrate by providing a layer 102 of solder, for example, a tin/lead alloy or a lead-free alloy. However, ball-less soldering, directly between pads, is also possible. This is the example of LGA packages, as shown in FIG. 1B. In this case, provision of a solder layer 103 allows the external connection pad 11 from the package to be soldered directly to the connection pad 101 on the substrate.

The fabrication of packages as described in the FIG. 1A or 1B, for example requires a heating step to bond the connection pads on the package to the connection pads on the substrate by soldering them together, whether or not they are equipped with balls. During this step, the package passes through a high-temperature oven. The temperature may reach about 230° C. or even higher when a lead-free solder is employed. Owing to the size of this type of package (typically measuring from 5 to 50 mm), the number of connection pads is considerable (several hundred or even several thousand) and, when passing through the oven, the temperature reached at the pads located in a central position of the package is much lower (by 40° C. to 80° C.) than that reached at the pads located on the periphery, in particular in plastic packages owing to the low thermal conduction of the materials used. This temperature nonuniformity at the various connection pads means that the heating temperature of the oven must be increased further so as to ensure that the temperature reached at the center will be sufficient for soldering, with the risk of damaging the electronic components in the package, and also all those outside the package.

SUMMARY OF THE INVENTION

The present invention aims to remedy the aforementioned drawbacks thanks to an electronic device provided, for its external connection, with pads distributed over its connection surface, characterized in that it includes a thermally conducting plate placed parallel to said connection surface and having a nonuniform structure, making it possible, when the device is exposed to a given external temperature, to supply a controlled amount of heat to each external connection pad according to its position on the connection surface.

The thermally conducting plate thus incorporated into the device distributes the heat supplied from the outside over the entire connection surface, thereby making it possible to reduce the heating temperature of the oven when soldering the external connection pads.

According to an alternative embodiment, the electronic device is a package type that includes support of the printed circuit type, the conducting plate forming an internal layer of the support.

According to another alternative embodiment, the conducting plate is a multilayer plate forming a thermal interconnection, making it possible to control the supply of heat to each external connection pad of the device.

The device according to the invention may have electronic components arranged on one or more levels according to various alternative embodiments.

BRIEF DESCRIPTION OF THE DRAWINGS

Other advantages and features will become more clearly apparent on reading the following description, illustrated by the appended figures which show:

FIG. 2, a first exemplary embodiment of an electronic device according to the invention (partial view), with a thermally conducting plate;

In the figures, identical elements are identified by the same references.

DETAILED DESCRIPTION OF THE EMBODIMENTS

Figure 1A:
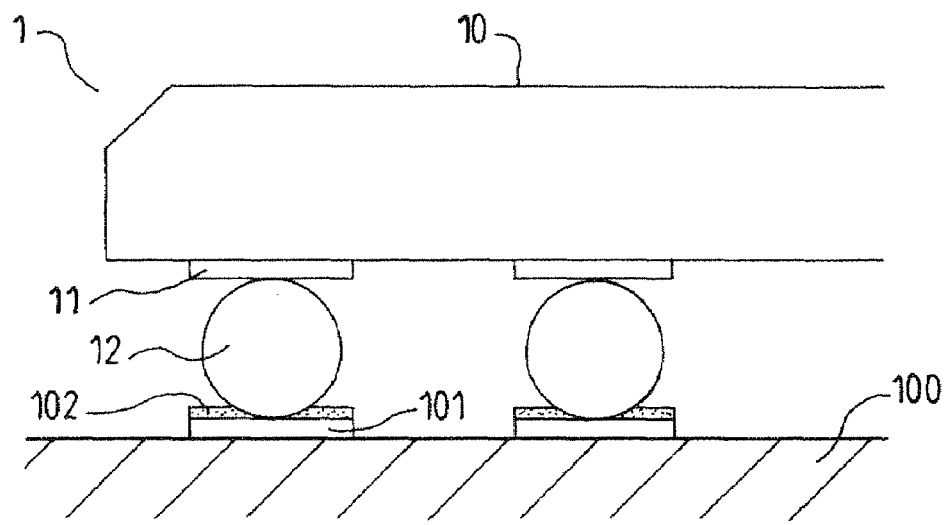
FIGS. 1A and 1B, examples of BGA and LGA packages (already described)
Figure 1B:
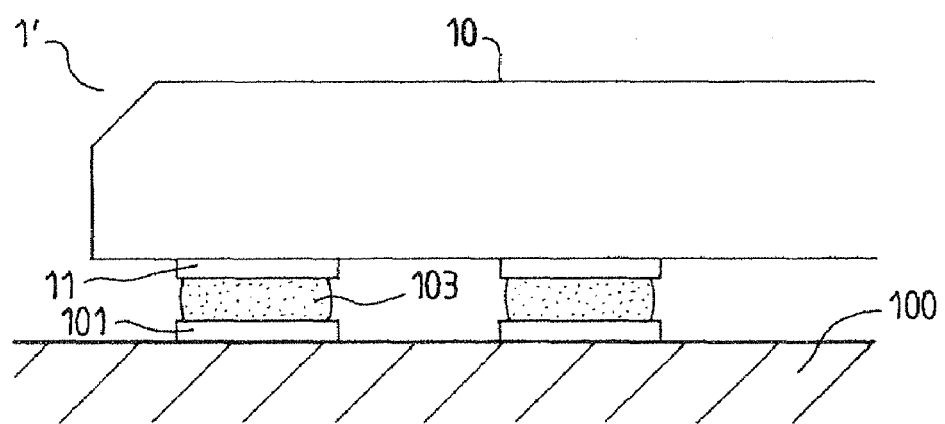

FIGS. 2, 3 and 4A, 4B show three exemplary embodiments of an electronic device according to the invention. These devices are of the BGA package type, but the invention applies equally well to other types of package. Only a few connection balls 12 have been shown for the sake of clarity, but in an actual device typically there may be a few hundred balls. The package includes a support 20 formed by at least one layer of electrically insulating material with an upper face 21 and a lower face 22, the lower face 22 forming the external connection surface of the device. The electronic device is provided for its external connection with pads 11 distributed over the connection surface 22. According to the invention, the device includes a thermally conducting plate 23 placed parallel to said connection surface 22 and having a nonuniform structure making it possible, when the device is exposed to a given external temperature, to supply a controlled amount of heat to each external connection pad 11 according to its position on the connection surface.

Figure 3:
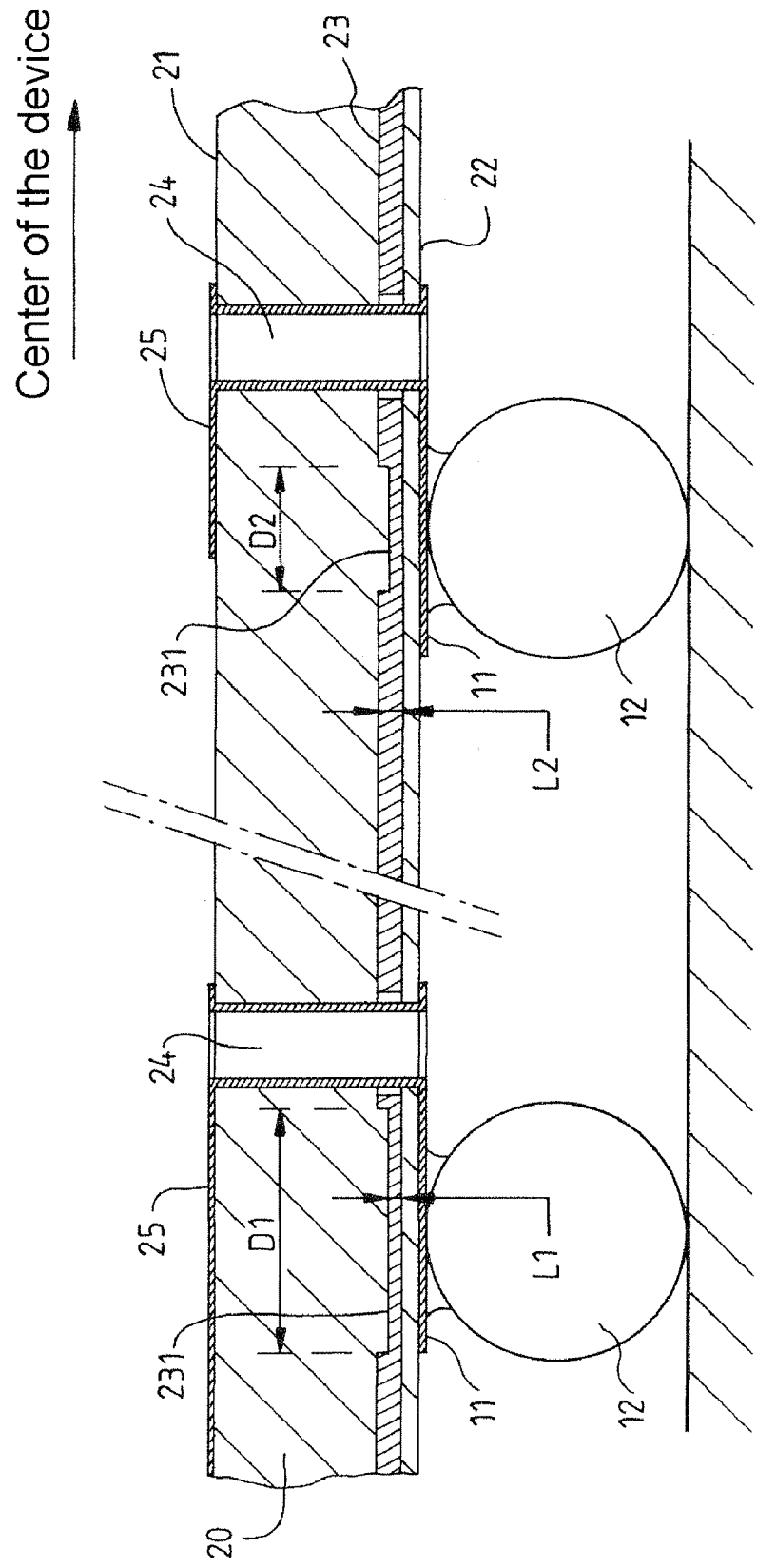
FIG. 3, a second exemplary embodiment of an electronic device according to the invention (partial view) with a thermally conducting plate.

According to the embodiment shown in FIGS. 2 and 3, the conducting plate 23 lies above said connection surface 22, that is to say on the opposite side to the face bearing the external connection pads 11.

In the embodiment shown in FIG. 2, the conducting plate is formed from a layer of thermally conducting material, for example copper or carbon, pierced by apertures 230 of variable geometry, lying for example above the connection pads 11. Thanks to the particular geometry of these apertures, the thermal resistance of the plate between the outside of the device and the zone lying above the pads may be controlled, making it possible to supply an amount of heat toward the center of the device that is comparable to that supplied on the periphery. To do this, the apertures are, for example formed from approximately cylindrical holes positioned above the pads 11 on the connection surface, the diameters $D_i$ of which are calculated according to the position of the pad on the connection surface in order to make the supply of heat substantially uniform over the entire surface. Thus, in the embodiment shown in FIG. 2, the diameter $D_2$ is greater than the diameter $D_1$, the diameters of the apertures 230 being larger the further away from the center of the device. The layer 23 of thermally conducting material is also pierced in this embodiment by holes 233 for passage of the electrical connectors 24 that connect the external connection pads 11 to internal connection pads 25, placed on the upper surface of the support 20, and that allow connection to the electronic components (not shown). In this example, the layer 23 of thermally conducting material lies parallel to the connection surface 22, as close as possible thereto so as to promote heat diffusion from the plate to the pads. Typically, the connection balls are placed at a distance D apart, where D is less than one millimeter. The aim will be to place the conducting plate 23 close to the connection surface, for example the thickness e1 separating the plate from said surface will be a few tens of microns, typically 50 μm, and the thickness of the plate between 30 and 150 μm.

In the embodiment shown in FIG. 3, the conducting plate 23 is also formed by a layer of thermally conducting material. However, unlike in FIG. 2, the apertures in the conducting plate have been replaced with zones of variable thickness, the thicknesses $L_1$, $L_2$ of which are also calculated so as to make the supply of heat approximately uniform over the entire surface. For example, the zones 231 are approximately cylindrical, positioned above the pads on the connection surface, and have variable diameters, denoted by $D_1$, $D_2$ in FIG. 3 depending on the position of these pads above which said zones lie.

Figure 4A:
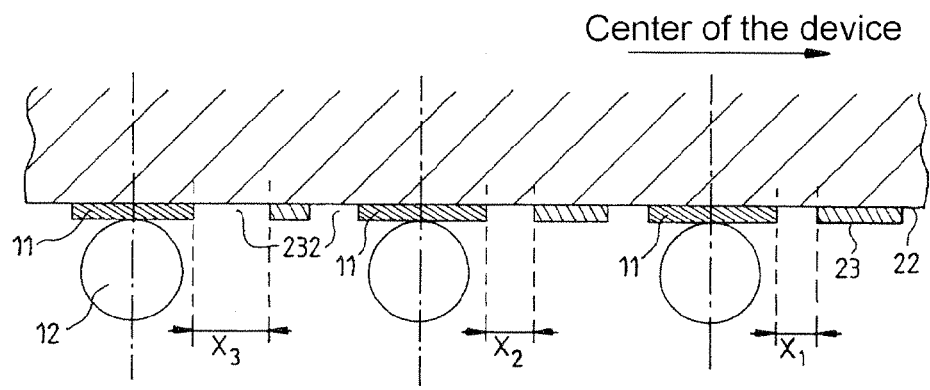
FIGS. 4A and 4B, a third exemplary embodiment of an electronic device according to the invention (partial view) with a thermally conducting plate, in two views.
Figure 4B:
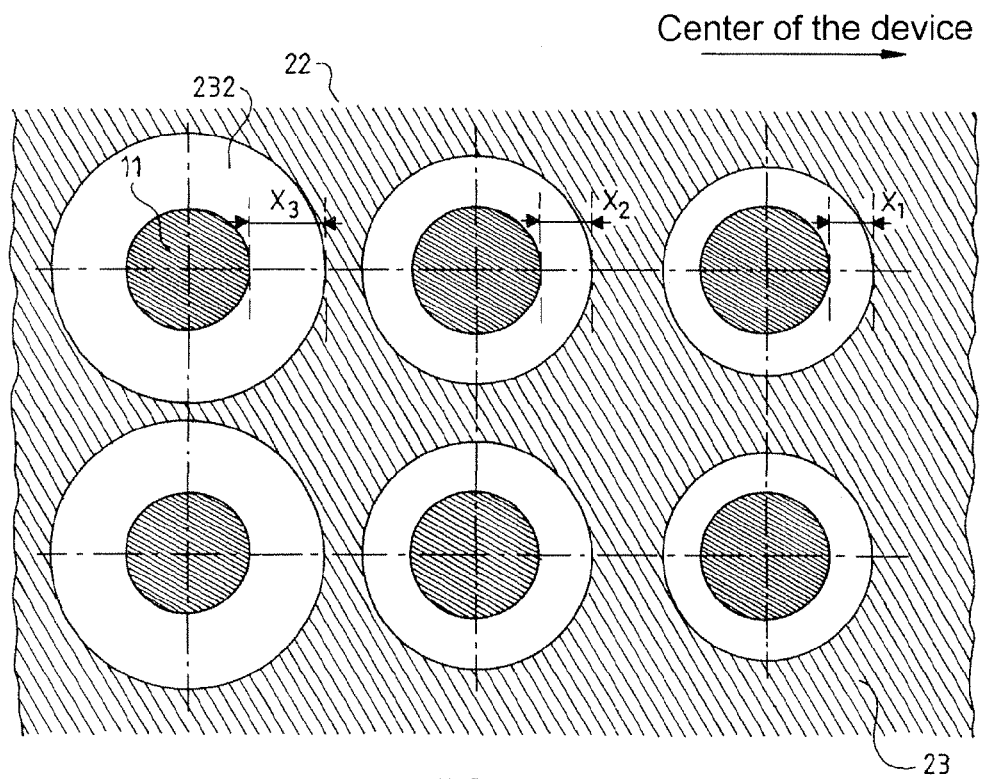

In the embodiment shown in FIGS. 4A and 4B, the conducting plate 23 lies below the connection surface 22, that is to say on the same side with respect to the connection surface as the external connection pads 11. This embodiment has the advantage of limiting heat losses in the support. In practice, the conducting plate 23 may be formed by a layer of thermally conducting material that also has electrical conduction properties, the external connection pads 11 being formed in the layer 23 itself. FIG. 4A shows a sectional view, while FIG. 4B shows a view from below (the balls 12 not being visible). For example, the conducting plate 23 is formed by a layer of thermally conducting and electrically conducting material, for example, copper, the plate being cut in a design revealing the external connection pads 11, leaving, around them, rings 232 without thermally conducting material, having variable diameters $X_3$, $X_2$, $X_1$, becoming respectively smaller as the center of the device is approached, again for the purpose of controlling the thermal resistance of the plate from the outside of the device to each of the connection pads 11, so as to attempt to achieve the greatest uniformity at each pad.

Figure 5A:
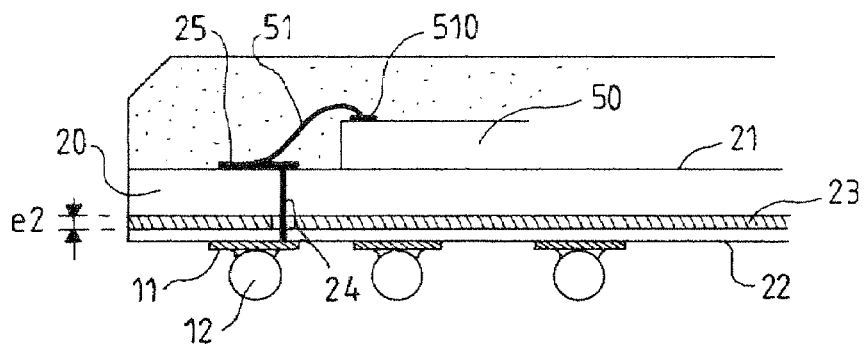
FIGS. 5A and 5B, sectional views of an electronic device according to the invention of the package type, with respectively one or several levels of electronic components, in one version.
Figure 5B:
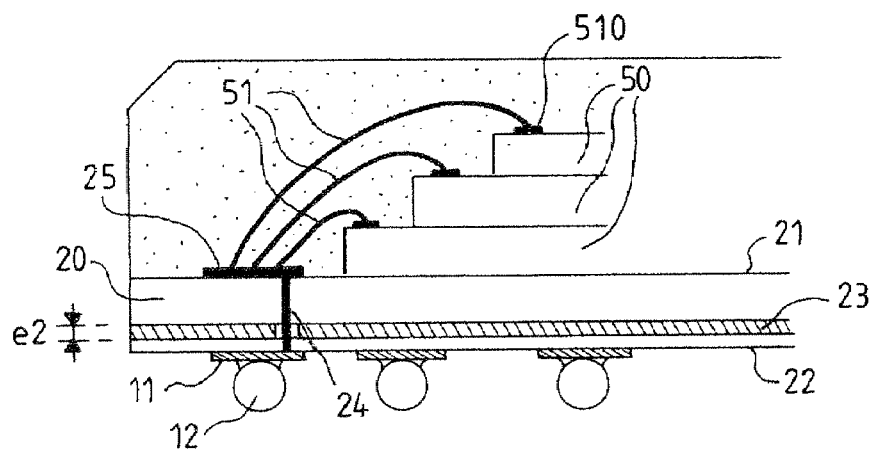
Figure 6:
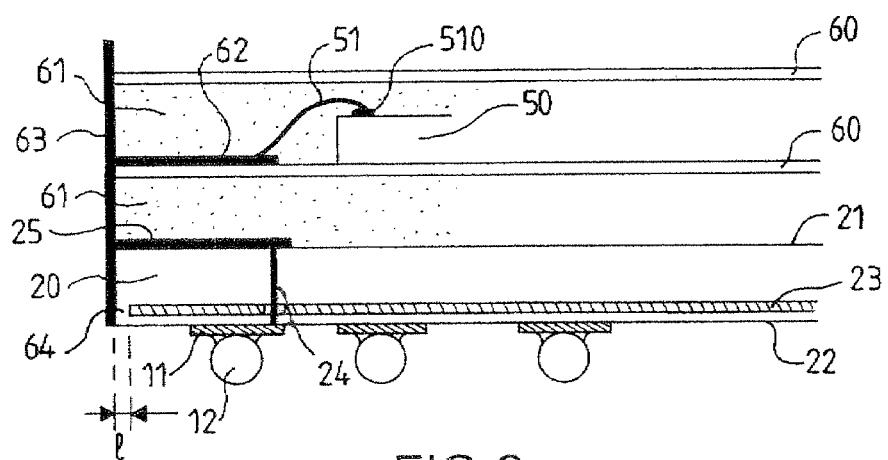
FIG. 6, a sectional view of an electronic device according to the invention of the package type with several levels of electronic components, in a second version.

FIGS. 5A, 5B and 6 show three embodiments of electronic devices according to the invention all of the BGA type, which are equipped with a thermally conducting plate 23 formed by a layer of thermally conducting material lying parallel to the connection surface 22, and having a nonuniform structure, making it possible, when the device is exposed directly to an external temperature, to supply a controlled amount of heat to each external connection pad 11. In these embodiments, the layer of conducting material is placed above the connection surface and has the shape, for example, of the plates described by means of FIGS. 2 and 3, only the holes for passage of the connectors 24 being shown. For example, when the support 20 is of a multilayer printed-circuit type, the layer 23 of thermally conducting material forms one of the layers of the printed circuit. In an alternative embodiment, the layer 23 could just as well lie below the connection surface as in the embodiment shown in FIG. 4A.

FIG. 5A shows an electronic package of the plastic package type with one level of components. The components, denoted by 50, are electrically connected to the support 20 of the package via a connection wire 51, which connects an internal connection pad 25 on the support to a connection pad 510 on the electronic component. The components are encapsulated with a layer of plastic of the epoxy type. FIG. 5B shows an electronic package of the plastic package type with several levels of components. The structure is similar to that of the package shown in FIG. 5A except the components are stacked on top of one another all being connected to internal connection pads 25 on the support 20 via connection wires 51.

FIG. 6 shows an electronic package of plastic package type having several levels of components. In this embodiment, the components are stacked in a three-dimensional structure of the type described in French Patent FR 2 670 323 in the name of the Applicant. In this structure, the electronic components 50 are arranged in given patterns on substrates 60, connected via connection wires 51 to connection pads 62 placed on the substrates. The substrates are encapsulated in an insulating layer 61 of epoxy type and stacked on top of one another, on the support 20. One feature of this structure is in particular the electrical connection of the components via the lateral faces of the package, by means of connections denoted by 63, which connect the connection pads 62 to the internal connection pads 25 on the support 20 and not via internal connection wires, directly connecting the connection pads on the components to the internal connection pads 25. In this case, the layer 23 of thermally conducting material is preferably of smaller dimensions than that of the support 20, so that there is no risk of a short circuit if the thermally conductive material used is also an electrical conductor. In this way, a band of insulation 61, of thickness $\ell$ present around the conducting plate provides the electrical insulation. Advantageously, the plate then has a given number of thermal connection leads on its periphery (not shown in FIG. 6).

Figure 7:
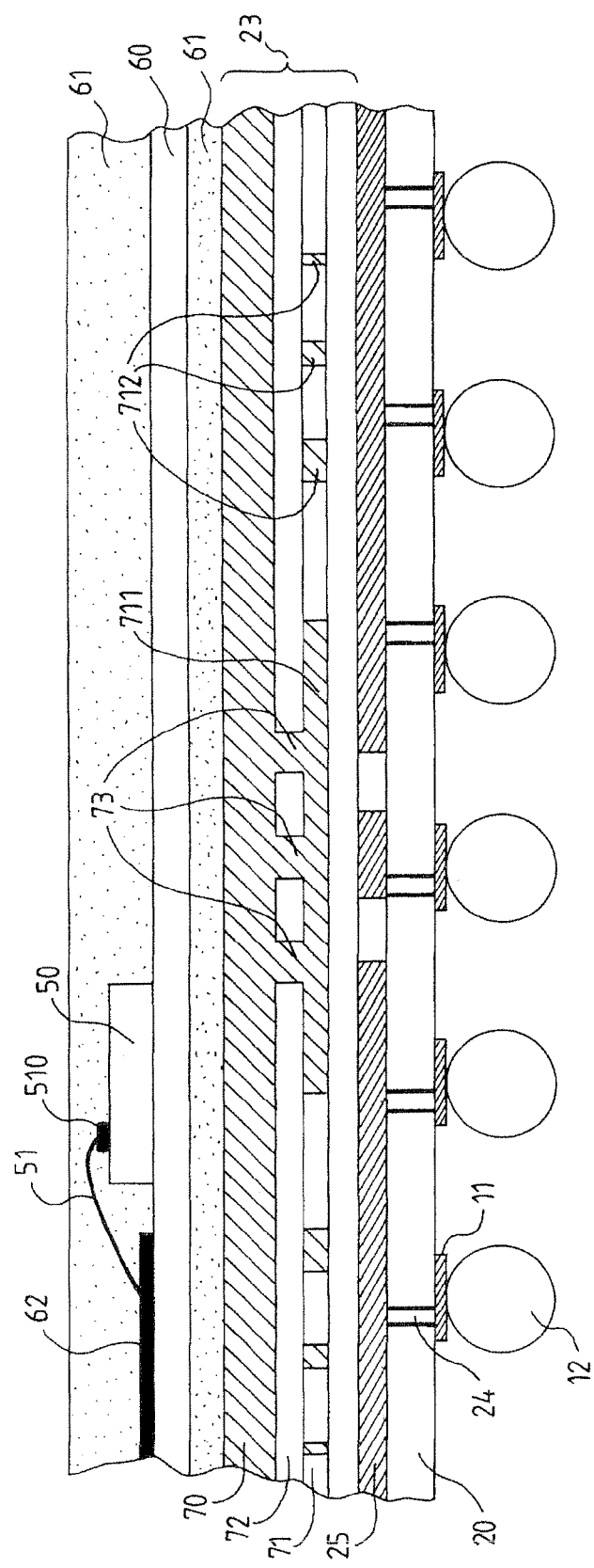
FIG. 7, an example of a thermally conducting plate according to a fourth exemplary embodiment, placed in an electronic device of the type of that shown in FIG. 6.

FIG. 7 shows an example of a thermally conducting plate according to a fourth exemplary embodiment, which is particularly useful in an electric device of the type shown in FIG. 6.

In this embodiment, the conducting plate 23 is formed by an alternation of layers of thermally conducting material and thermally insulating material in such a way as to form a thermal interconnection for controlling the amount of heat supplied to each pad. More precisely, in this embodiment, the plate 23 comprises a uniform upper first layer 70 of thermally conducting material and a lower second layer 71 of thermally conducting material that is thermally coupled to said first layer by thermal connections 73. The two layers 70 and 71 are separated by a layer 72 of thermally insulating material. The lower layer 71 has a nonuniform geometry, forming a set of thermal conductors (711, 712) of variable thermal resistance, arranged in a given pattern in order to control the amount of heat supplied to each external connection pad 11.

Figure 8A:
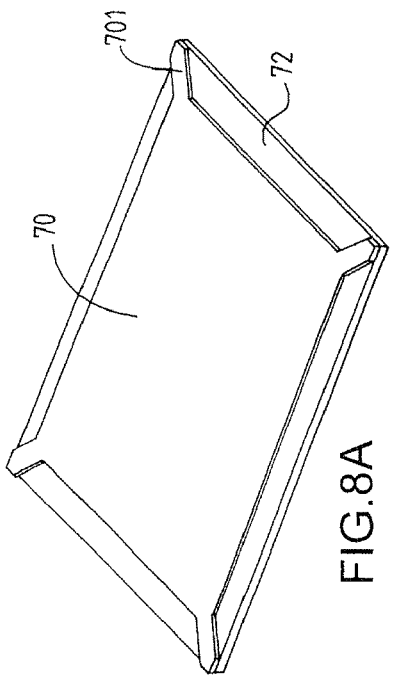
FIGS. 8A to 8D, views of the device shown in FIG. 7.
Figure 8B:
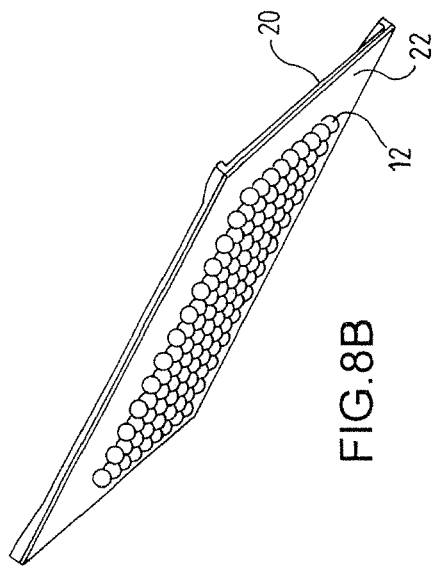
Figure 8C:
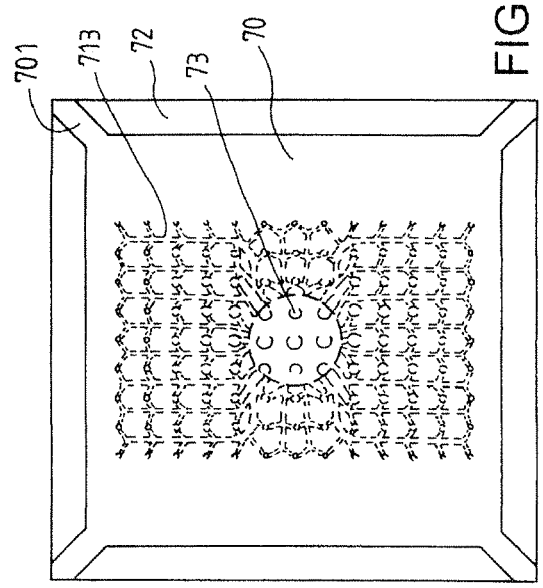
Figure 8D:
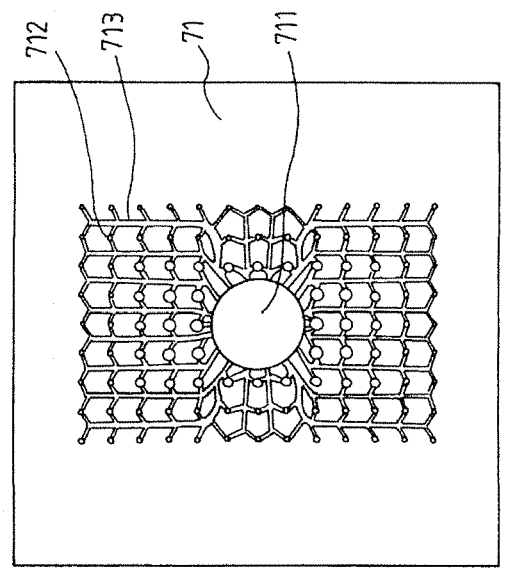

This embodiment is illustrated by means of the various partial view of the device illustrated in FIGS. 8A to 8D. FIG. 8A shows a top view of the upper first layer 70 of thermally conducting material, placed on the layer 72 of insulating material. The layer 70 is substantially uniform and, as in the embodiment shown in FIG. 6, has smaller dimensions than the layer of insulating material so as not to cause a short circuit with the lateral electrical connections (not shown) when it is made of a material also having electrical conduction properties. As previously, thermal connection leads 701 are then provided on its periphery, one at each corner, or all around the layer, in order to improve external heat conduction. FIG. 8B shows a view from beneath the electronic device, which shows the connection balls 12 fastened to the pads on the external connection surface 22, on the lower face of the support 20. FIGS. 8C and 8D show an example of the geometry of the lower layer 71. FIG. 8C is a top view of the upper layer 70 and FIG. 8D is a top view of the layer 71. The elements of the lower layers are indicated by the dotted lines in FIG. 8C. In particular, shown in dotted lines are the thermal connections 73 that connect, through the thermally insulating layer 72, the thermally conducting layer 70 to the thermally conducting layer 71. In this embodiment, the geometry of the thermally conducting layer 71 consists of a central disk (711) connected to the layer 70 by the thermal connections 73, of pads 712 of various sizes depending on the position on the layer, and of thermally conducting lines 713, thus forming the thermal conductors of variable thermal resistance, which make it possible to supply, above each external connection pad 11 of the electronic device, substantially the same amount of heat, irrespective of their position on the connection surface.

The invention claimed is:

1. An electronic device provided for its external connection with pads distributed over a connection surface, comprising:
a heat-conducting plate placed parallel to the connection surface and having a nonuniform structure formed from a layer of heat-conducting material having zones of variable thickness that are positioned above the pads on the connection surface, making it possible, when the device is exposed to a given external temperature, to supply a controlled amount of heat to each external connection pad according to its position on the connection surface, wherein the heat-conducting plate partially covers each of the pads, and each one of the zones of variable thickness is spaced above and aligned with a respective one of the pads.

2. The electronic device as claimed in claim 1, wherein said conducting plate is above said connection surface.

3. The electronic device as claimed in claim 2, wherein, when the thickness of the zones is zero, the zones form apertures and in that these apertures are of variable geometry.

4. The electronic device as claimed in claim 1, wherein the zones are approximately cylindrical with a diameter that varies with the position.

5. The electronic device as claimed in claim 2, wherein said conducting plate is formed by an alternation of layers made of thermally conducting material and thermally insulating material, in such a way as to form a thermal interconnection for controlling the supply of heat to each pad.

6. The electronic device as claimed in claim 5, wherein said plate comprises a uniform upper first layer of thermally conducting material and a lower second layer of thermally conducting material that is thermally coupled to said first layer, forming an assembly of thermal conductors of variable thermal resistance that are arranged in a given pattern in order to control the supply of heat to each pad.

7. The device as claimed in claim 1, wherein said thermally conducting material is copper.

8. The device as claimed in claim 1, wherein said thermally conducting material is carbon.

9. The electronic device as claimed in claim 1, wherein said conducting plate lies below said connection surface and also has electrical conduction properties, the external connection pads being formed in said layer.

10. The electronic device as claimed in claim 1, wherein the device is of the package type, comprising a support formed by at least one layer of electrically insulating material with an upper face and a lower face, the lower face forming said external connection surface of the device, and furthermore including a set of electronic components placed on one or more levels, the components being connected by electrical conductors to internal connection pads on the upper face of said support, the internal connection pads being connected to said pads on the external connection surface.

11. The electronic device as claimed in claim 10, wherein, when said support is a multilayer support and said conducting plate lies above said connection surface, said conducting plate forms one or more of said layers of the support, said plate being pierced for passage of said electrical connectors.

12. The electronic device as claimed in claim 10, wherein said electronic components are arranged on said support on various levels, the components of the upper levels being connected to the internal connection pads via connections located on external lateral faces of the package.

13. The electronic device as claimed in claim 12, wherein, when said thermally conducting plate has at least one layer of conducting material, said layer has smaller dimensions than that of the support and has a given number of thermal connection leads on its periphery.

14. The electronic device as claimed in claim 1, wherein said external connection pads are provided with balls.

15. The electronic device as claimed in claim 2, wherein the zones are approximately cylindrical with a diameter that varies with the position.

16. The electronic device as claimed in claim 3, wherein the zones are approximately cylindrical with a diameter that varies with the position.

17. The electronic device as claimed in claim 2, the device is of the package type, comprising a support formed by at least one layer of electrically insulating material with an upper face and a lower face, the lower face forming said external connection surface of the device, and furthermore including a set of electronic components placed on one or more levels, the components being connected by electrical conductors to internal connection pads on the upper face of said support, the internal connection pads being connected to said pads on the external connection surface.

18. The electronic device as claimed in claim 3, the device is of the package type, comprising a support formed by at least one layer of electrically insulating material with an upper face and a lower face, the lower face forming said external connection surface of the device, and furthermore including a set of electronic components placed on one or more levels, the components being connected by electrical conductors to internal connection pads on the upper face of said support, the internal connection pads being connected to said pads on the external connection surface.

19. The electronic device as claimed in claim 4, the device is of the package type, comprising a support formed by at least one layer of electrically insulating material with an upper face and a lower face, the lower face forming said external connection surface of the device, and furthermore including a set of electronic components placed on one or more levels, the components being connected by electrical conductors to internal connection pads on the upper face of said support, the internal connection pads being connected to said pads on the external connection surface.

20. The electronic device as claimed in claim 5, the device is of the package type, comprising a support formed by at least one layer of electrically insulating material with an upper face and a lower face, the lower face forming said external connection surface of the device, and furthermore including a set of electronic components placed on one or more levels, the components being connected by electrical conductors to internal connection pads on the upper face of said support, the internal connection pads being connected to said pads on the external connection surface.

* * * * *